US007068532B2

(12) United States Patent
Motoyoshi

(10) Patent No.: US 7,068,532 B2
(45) Date of Patent: Jun. 27, 2006

(54) MAGNETIC STORAGE DEVICE, WRITING METHOD FOR MAGNETIC STORAGE DEVICE AND MANUFACTURING METHOD FOR MAGNETIC STORAGE DEVICE

(75) Inventor: Makoto Motoyoshi, Tokyo (JP)

(73) Assignee: Sony Corporation (JP)

( * ) Notice: Subject to any disclaimer, the term of this patent is extended or adjusted under 35 U.S.C. 154(b) by 28 days.

(21) Appl. No.: 10/941,842

(22) Filed: Sep. 16, 2004

(65) Prior Publication Data

US 2005/0063221 A1    Mar. 24, 2005

(30) Foreign Application Priority Data

Sep. 24, 2003    (JP)    ............................. 2003-330955

(51) Int. Cl.
*G11C 11/00* (2006.01)
(52) U.S. Cl. ........................................ 365/158; 365/171
(58) Field of Classification Search ................ 365/158, 365/171, 173
See application file for complete search history.

(56) References Cited

U.S. PATENT DOCUMENTS 6,842,367 B1 *  1/2005  Hidaka ..................... 365/173
6,856,538 B1 *  2/2005  Hidaka ..................... 365/171

OTHER PUBLICATIONS

J. M. Daughton, "Thin Solid Films", vol. 216, pp. 162-168, 1992.

D. D. Tang et al., An IC process Compatible Nonvolatile Magnetic RAM, IEDM Technical Digest, pp. 997-999 (1995).
R. Meservey et al., "Spin-polarizing electron tunneling", Physics Reports, vol. 238, pp. 214-217 (1994).
T. Miyazaki et al., "Giant magnetic tunneling effect in Fe/Al$_2$)$_3$FE junction", Journal of Magnetism & Magnetic Materials, vol. 139, L231 (1995).
R. Scheurelein et al., "A 10ns Read and Write Non-Volatile Memory Array Using a Magnetic Tunnel Junction and FET Switch in each Cell", IEEE ISSCC Digest of Technical Papers, pp. 128-129, Feb. 2000.

* cited by examiner

*Primary Examiner*—Michael Tran
(74) *Attorney, Agent, or Firm*—Rader, Fishman & Grauer, PLLC; Ronald P. Kananen

(57) ABSTRACT

A magnetic storage device is disclosed by which reduction of the power consumption and stabilization of a writing characteristic can be achieved. The magnetic storage device includes a plurality of magnetic tunnel junction elements having different coercive forces from each other, and electric current corresponding to the coercive force is supplied to each magnetic tunnel junction element. More particularly, the magnetic storage device includes a plurality of storage element sets each including a magnetic tunnel junction element, and a plurality of power supplies for individually supplying writing currents corresponding to coercive forces of the magnetic tunnel junction elements of the storage element sets. The magnetic tunnel junction element of at least one of the storage element sets has a coercive force different from that of the magnetic tunnel junction element of the other storage element set.

11 Claims, 9 Drawing Sheets

F I G. 1
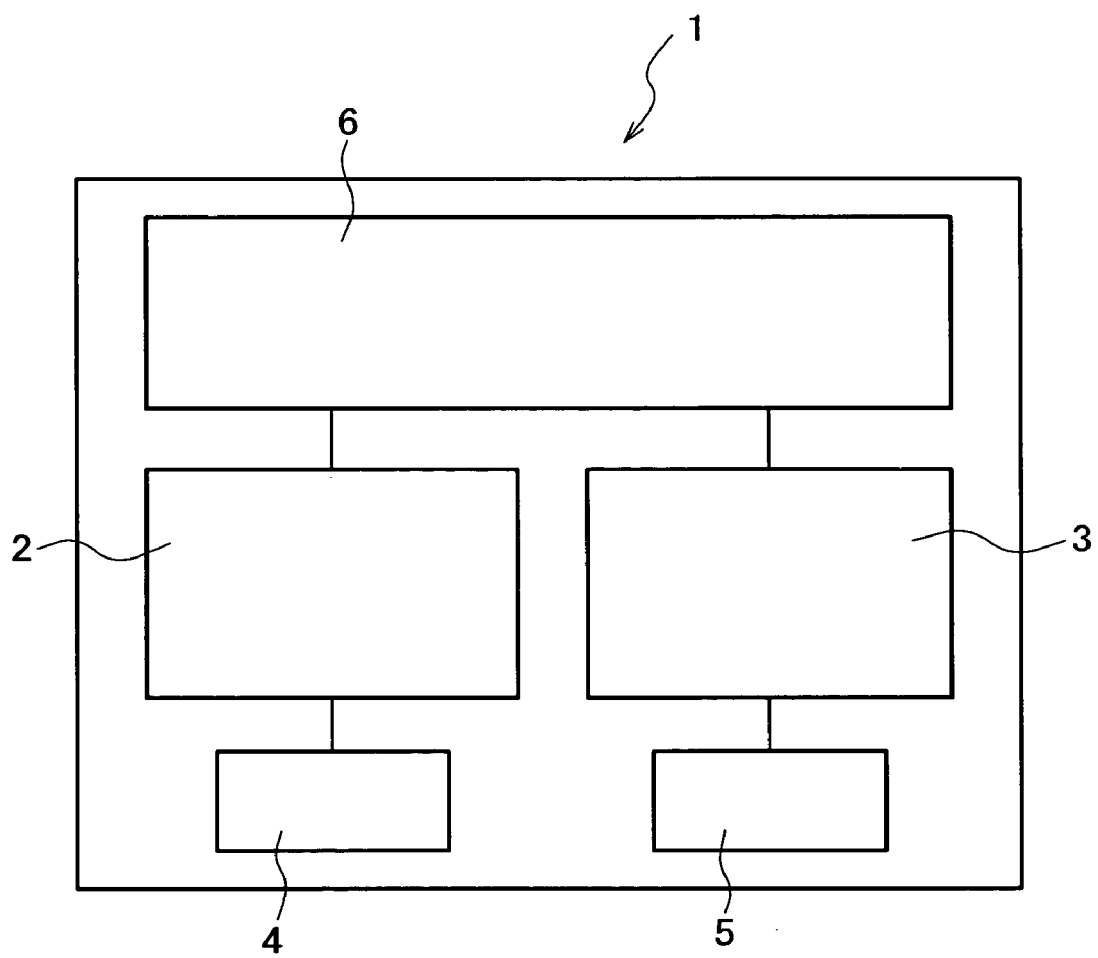

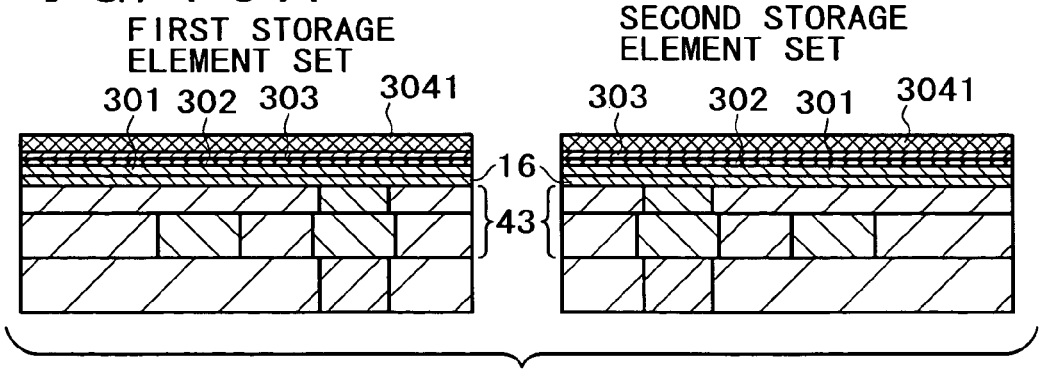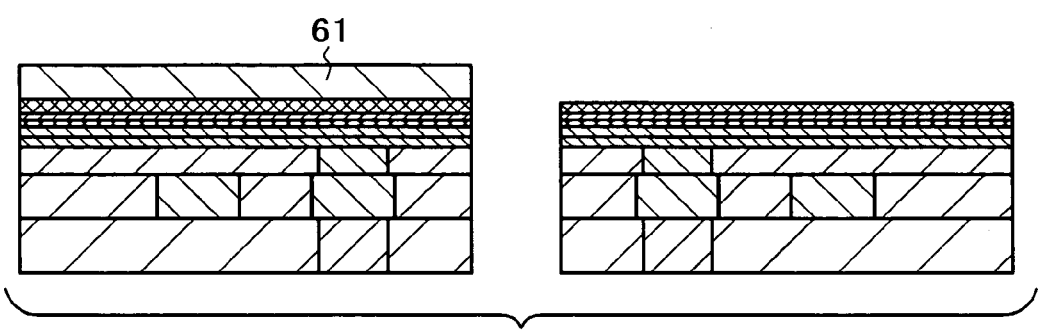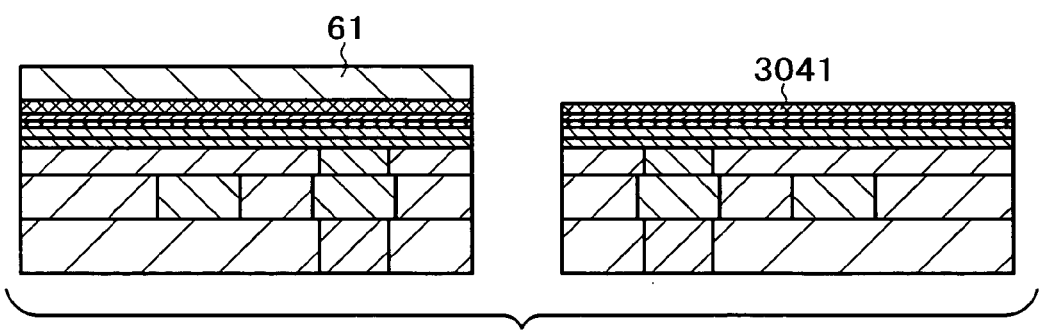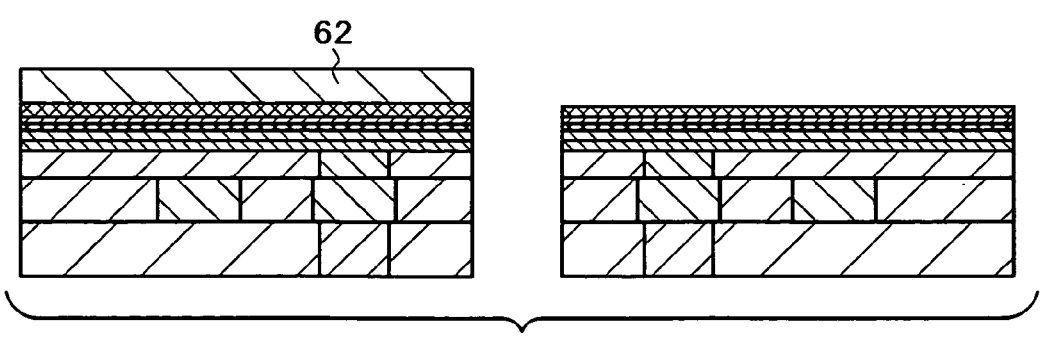

MAGNETIC STORAGE DEVICE, WRITING METHOD FOR MAGNETIC STORAGE DEVICE AND MANUFACTURING METHOD FOR MAGNETIC STORAGE DEVICE

BACKGROUND OF THE INVENTION

This invention relates to a magnetic storage device, a writing method for a magnetic storage device and a manufacturing method for a magnetic storage device, and more particularly to a nonvolatile magnetic storage device that stores information by making use of a phenomenon wherein the resistance value varies depending upon whether the spin direction of a ferromagnetic substance is in a parallel direction or an anti-parallel direction, a writing method for a magnetic storage device and a manufacturing method for a magnetic storage device.

With the rapid progress of information communication equipments, particularly of small size equipments for personal use, such as portable terminals, further progress in performance, such as increases in integration, increases in speed and reduction in power consumption, is demanded for component devices of communication equipments, such as memory devices and logic devices. Particularly, nonvolatile memory is considered to be an essential device required in the age of ubiquitous computing and communications.

For example, even if the power supply is used up or suffers from some trouble or a server and a network are disconnected from each other by some trouble, nonvolatile memory can protect important information. Thus, increases in the density and the capacity of a nonvolatile memory becomes progressively significant as a technique for replacing a hard disk or an optical disk with which miniaturization is essentially impossible due to the presence of a movable part.

Further, while recent portable equipments have been designed such that unnecessary circuit blocks are placed into a standby state to suppress the power consumption as far as possible, if a nonvolatile memory which can serve both as a high speed network memory and a large capacity storage memory can be implemented, then the power consumption and non-productive use of the memory capacity can be minimized. Also an instant-on function which a device can start up instantly when the power supply is made available, can be implemented if a high-speed large-capacity nonvolatile memory can be implemented.

As nonvolatile memories, a flash memory which uses a semiconductor and an FRAM (Ferroelectric Random Access Memory) which uses a ferroelectric substance are available. However, flash memory has a drawback that the writing speed is as low as the microsecond order. On the other hand, FRAM has a drawback that the number of times by which it can be rewritten is 1,012 to 1,014 and the durability is not sufficiently high to fully replace a static random access memory or a dynamic random access memory. Also, another problem to be solved is that fine working of a ferroelectric capacitor is difficult.

Attention is paid to a magnetic memory called MRAM (Magnetic Random Access Memory) as a nonvolatile memory that does not have the drawbacks of the FRAM. MRAMs were initially based on a spin valve that makes use of an AMR (Anisotropic Magneto Resistive) effect (refer to, for example, J. M. Daughton, "Thin Solid Films", Vol. 216, pp. 162–168, 1992 (hereinafter referred to as Non-Patent Document 1)) or a GMR (Giant Magneto Resistance) effect (refer to, for example, D. D. Tang et al., "IEDM Technical Digest", pp. 997–999, 1995 (hereinafter referred to as Non-Patent Document 2)). However, the MRAMs of the types described have a drawback that, since the memory cell resistance of the load is as low as 10 Ω to 100 Ω, the power consumption per bit upon reading out is high and it is difficult to increase the capacity.

Meanwhile, the TMR (Tunnel Magneto Resistance) effect exhibits a rate of change in resistance of only 1% to 2% (refer to, for example, R. Meservey et al., "Physics Reports", Vol. 238, pp. 214–217, 1994 (hereinafter referred to as Non-Patent Document 3)). However, in recent years, a rate of change in resistance of approximately 20% has been obtained (refer to, for example, T. Miyazaki et al., "J. Magnetism & Magnetic Material", Vol. 139, L231, 1995 (hereinafter referred to as Non-Patent Document 4)), and attention has been paid to an MRAM which makes use of the TMR effect.

Since the MRAM is simple in structure, it is easy to achieve high integration, and since rotation of the magnetic moment is utilized for recording, it is estimated that the number of times by which it can be rewritten is great. Also, it is estimated that the MRAM allows very high speed accessing, and it has been reported already that the MRAM can operate at 100 MHz (refer to, for example, R. Scheuerlein et al., "ISSCC Digest of Technical Papers", pp. 128–129, February 2000 (hereinafter referred to as Non-Patent Document 5)).

While the MRAM has the advantage that it is easy to raise the speed and achieve high integration as described above, it has the following problems. A conventional MRAM is formed from a memory array of a single MTJ shape. In order to achieve high thermal stability to achieve the storage retaining time as long as 10 years, it is necessary to design the MTJ element of the MRAM so as to have a high antimagnetic field. Also, in an MRAM memory chip in which a functioning block, which retains information for a comparatively short period of time and operates at a high speed, and another functioning block, which must retain information for a long period of time although it is accessed less frequently, are provided in a mixed manner, since the switching magnetic field is set to a comparatively high level for all of the functioning blocks so that at least retention of information for a long period of time may be assured. Therefore, the MRAM memory has a problem that the overall power consumption upon writing is high.

SUMMARY OF THE INVENTION

It is an object of the present invention to provide a magnetic storage device, a writing method for a magnetic storage device and a manufacturing method for a magnetic storage device by which reduction of the power consumption and stabilization of a writing characteristic can be achieved.

In order to attain the object described above, according to an aspect of the present invention, there is provided a magnetic storage device, comprising a plurality of storage element sets each including a magnetic tunnel junction element, and a plurality of power supplies for individually supplying writing currents corresponding to coercive forces of the magnetic tunnel junction elements of the storage element sets, the magnetic tunnel junction element of at least one of the storage element sets having a coercive force different from that or those of the magnetic tunnel junction element or elements of the other storage element set or sets.

The magnetic storage device includes a plurality of storage element sets each including a magnetic tunnel junction element and a plurality of power supplies for individually supplying writing currents to the storage element sets, and the magnetic tunnel junction element of at least one of the storage element sets has a coercive force different from that or those of the magnetic tunnel junction element or elements of the other storage element set or sets. Therefore, the writing power can be reduced by using a magnetic tunnel junction element having a low coercive force for the storage element set into which data are rewritten frequently. On the other hand, where a magnetic tunnel junction element having a high coercive force is used for another storage element set into which data are rewritten less frequently, high thermal stability can be assured to assure a sufficiently long retention period (for example, retention for 10 years at 125° C.). Since a chip design can be performed in such a manner as just described, there is an advantage that an integrated circuit chip of a magnetic storage device which exhibits low power consumption over the overall chip and is superior in data retaining characteristic can be implemented. In other words, there is an advantage that implementation of a magnetic random access memory which exhibits low power consumption and is superior in data retaining characteristic can be anticipated.

According to another aspect of the present invention, there is provided a writing method into a magnetic storage device which includes a plurality of storage element sets each including a magnetic tunnel junction element and a plurality of power supplies for individually supplying writing currents corresponding to coercive forces of the magnetic tunnel junction elements of the storage element sets, the magnetic tunnel junction element of at least one of the storage element sets having a coercive force different from that or those of the magnetic tunnel junction element or elements of the other storage element set or sets, the writing method comprising a step of using a writing electric current corresponding to the coercive force of the magnetic tunnel junction element which forms each of the storage element sets to write information into the storage element set.

With the writing method into a magnetic storage device, since information is written into each of the storage element sets with a corresponding writing current, information can be written with minimum electric current corresponding to each of the storage element sets. Therefore, the writing power can be reduced by using a magnetic tunnel junction element having a low coercive force for the storage element set into which data are rewritten frequently. On the other hand, where a magnetic tunnel junction element having a high coercive force is used for another storage element set into which data are rewritten less frequently, high thermal stability can be assured to assure a sufficiently long retention period (for example, retention for 10 years at 125° C.). Since a chip design can be performed in such a manner as just described, there is an advantage that an integrated circuit chip of a magnetic storage device which exhibits low power consumption over the overall chip and is superior in data retaining characteristic can be implemented. In other words, there is an advantage that the writing method makes it possible for a magnetic random access memory to achieve writing with low power consumption and with a superior data retaining characteristic.

According to a further aspect of the present invention, there is provided a manufacturing method for a magnetic storage device which includes a plurality of storage element sets each including a magnetic tunnel junction element and a plurality of power supplies for individually supplying writing currents corresponding to coercive forces of the magnetic tunnel junction elements of the storage element sets, the magnetic tunnel junction element of at least one of the storage element sets having a coercive force different from that or those of the magnetic tunnel junction element or elements of the other storage element set or sets, the manufacturing method comprising the steps of forming a thin film layer from which the magnetic tunnel junction elements are to be formed, and using a single mask on which patterns for the storage element sets including the magnetic tunnel junction elements having different coercive forces from each other are drawn to work the thin film layer to form the storage element sets at a time.

With the manufacturing method for a magnetic storage device, after a thin film layer from which magnetic tunnel junction elements are to be formed is formed, a single mask on which patterns of storage element sets including magnetic tunnel junction elements having different coercive forces from each other are drawn can be used to work the thin film layer to form the storage element sets at a time. In other words, magnetic tunnel junction elements having different coercive forces from each other can be formed selectively and separately on the same chip almost without modifying a conventional process. For example, the writing power can be reduced by forming a magnetic tunnel junction element having a low coercive force for the storage element set into which data are rewritten frequently. On the other hand, where a magnetic tunnel junction element having a high coercive force is formed for another storage element set into which data are rewritten less frequently, high thermal stability can be assured to assure a sufficiently long retention period (for example, retention for 10 years at 125° C.). Consequently, there is an advantage that an integrated circuit chip of a magnetic storage device which exhibits low power consumption over the overall chip and is superior in data retaining characteristic can be implemented. In other words, there is an advantage that implementation of a magnetic random access memory which exhibits low power consumption and is superior in data retaining characteristic can be anticipated.

The magnetic storage device, writing method for a magnetic storage device and manufacturing method for a magnetic storage device of the present invention can be applied particularly to a magnetic random access memory.

The above and other objects, features and advantages of the present invention will become apparent from the following description and the appended claims, taken in conjunction with the accompanying drawings in which like parts or elements denoted by like reference symbols.

BRIEF DESCRIPTION OF THE DRAWINGS

FIG. 1 is a block diagram showing a magnetic recording device to which the present invention is applied;

FIGS. 10A to 10D and 11A to 11C are sectional views illustrating several steps of a manufacturing method for a magnetic recording device according to a third embodiment of the present invention.

DESCRIPTION OF THE PREFERRED EMBODIMENTS

Embodiment 1

Figure 2:
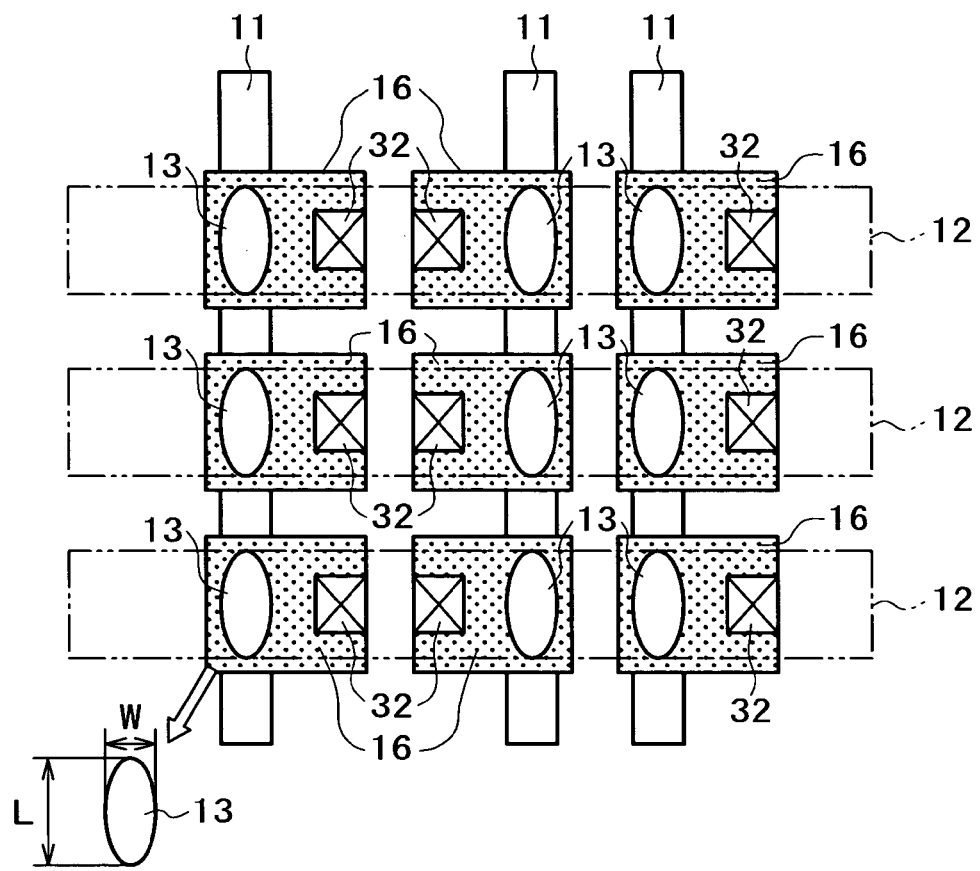
FIG. 2 is a schematic view showing an example of a layout of the magnetic storage device of FIG. 1.

Referring first to FIG. 1, there is shown a magnetic storage device to which the present invention is applied.

The magnetic storage device 1 shown includes a plurality of storage element sets including magnetic tunnel junction elements having different coercive forces from each other. In particular, the magnetic storage device 1 shown in FIG. 1 includes a first storage element set 2 in the form of a cell array formed from a plurality of first magnetic tunnel junction elements having a low coercive force and a second storage element set 3 in the form of a cell array formed from a plurality of magnetic tunnel junction elements having a coercive force higher than that of the first magnetic tunnel junction elements. The magnetic storage device 1 further includes a first power supply 4 for supplying electric current to the first storage element set 2 and a second power supply 5 for supplying electric current to the second storage element set 3. A logic circuit 6 is connected to control the first storage element set 2 and the second storage element set 3.

In the magnetic storage device 1, magnetic tunnel junction elements having a plurality of (two in FIG. 1) different switching magnetic fields are formed. Accordingly, for example, management data as an example of information which is rewritten in a high frequency can be accommodated in the first storage element set 2 while general information and body data which are rewritten in a low frequency can be accommodated in the second storage element set 3. Where the storage element sets wherein magnetic tunnel junction elements have different coercive forces from each other are selectively used depending upon the rewriting frequency in this manner, a memory system wherein the overall writing power consumption can be suppressed to be low and the liability is high can be obtained.

Now, a writing method into the magnetic storage device is described with reference to FIG. 1. According to the writing method, information is written with writing electric current corresponding to each of the storage element sets. For example, since the first storage element set 2 is formed from magnetic tunnel junction elements having a coercive force lower than that of the second storage element set 3, writing into the first storage element set 2 can be performed with lower electric current than that which is used to write into the second storage element set 3. For example, where data are rewritten frequently, the first storage element set 2 for which magnetic tunnel junction elements having a low coercive force are used can be used to lower the writing current. Consequently, since minimized electric current can be used for writing, reduction of the power consumption can be anticipated. On the other hand, where the frequency in rewriting of data is low, the second storage element set 3 for which magnetic tunnel junction elements having a high coercive force are used can be used to assure high thermal stability to assure a sufficiently long retention period (for example, retention for 10 years at 125° C.). In this manner, an integrated circuit chip which exhibits low power consumption over the overall chip and is superior in data retaining characteristic is achieved. In other words, there is an advantage that writing by low power consumption superior in data retaining characteristic can be achieved with a magnetic random access memory (hereinafter referred to as MRAM) device.

It is to be noted that, while the magnetic storage device 1 described above includes the first power supply 4 for supplying electric current to the first storage element set 2 and the second power supply 5 for supplying electric current to the second storage element set 3, the first power supply 4 and the second power supply 5 may otherwise be formed as a single unitary power supply. In the configuration which includes a single power supply in this manner, it is necessary for the single power supply to be provided with a function of controlling electric current to be supplied to each of the storage element sets so that a minimum but necessary electric current to perform writing into the magnetic tunnel junction elements of the storage element sets 2 and 3 may be supplied.

Now, an example of a cell layout is described with reference to FIG. 2. FIG. 2 particularly shows a cell layout configuration of a 1T1MTJ type which includes a single selection element (1 transistor) and a single magnetic tunnel junction element (1 TMR element).

In the cell layout shown, writing word lines 11 and bit lines 12 are disposed such that they intersect three-dimensionally with each other, for example, perpendicularly with each other as seen in FIG. 2. A magnetic tunnel junction element 13 is disposed at each of intersection regions of the writing word lines 11 and the bit lines 12. The magnetic tunnel junction element 13 may be, for example, a TMR element. Leader electrodes 16 formed from an antiferromagnetic layer are disposed as an underlying layer of the magnetic tunnel junction elements 13 in parallel to the bit lines 12. Each of the leader electrodes 16 is connected to a selection element (a switching element such as a transistor or a diode) through a contact 32 such as a plug, a landing pad and a contact (not shown).

The magnetic tunnel junction element 13 has an elliptical or oblong shape as viewed in a plan layout. Where the major diameter is represented by L and the minor diameter by W, the aspect ratio of the magnetic tunnel junction element 13 is represented by L/W. A relationship between the coercive force and the aspect ratio of the magnetic tunnel junction element 13 was determined through a simulation, and a result of the determination is described below with reference to FIG. 3.

Figure 3:
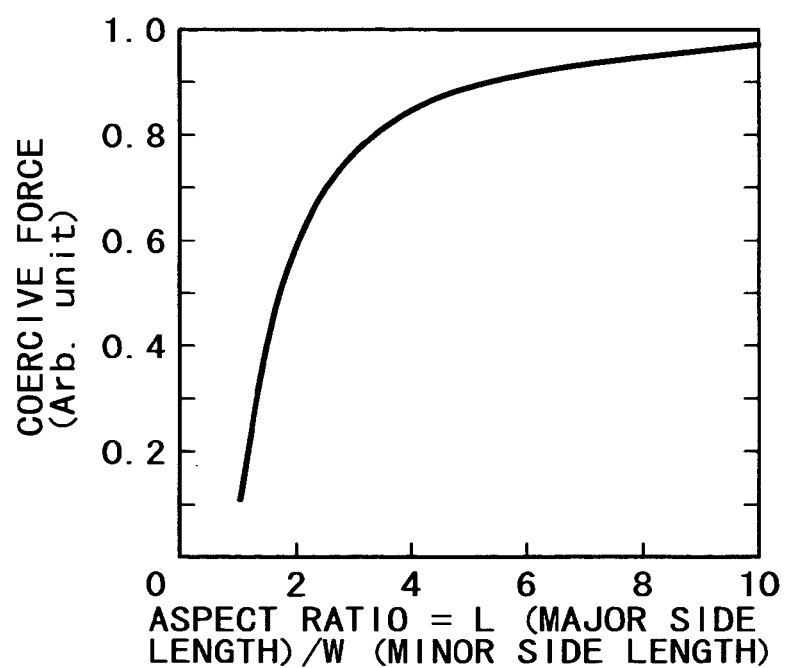
FIG. 3 is a graph illustrating a relationship between the coercive force and the aspect ratio of a magnetic tunnel junction element determined through a simulation.

As seen from FIG. 3, as the aspect ratio decreases, the coercive force decreases. It can be seen that the coercive force decreases suddenly where the aspect ratio is lower than 4. Since the magnetic tunnel junction element 13 is formed using a mask formed from a photoresist or an inorganic material on which a photoresist is formed into a mask, the aspect ratio should be adjusted by adjusting the mask size at the magnetic tunnel junction element forming step so that each functioning block in one LSI chip may have a predetermined coercive force. The adjustment of the aspect ratio is performed by varying the major side length, the minor side length or both of the major and minor side lengths of the magnetic tunnel junction element section. For example, if the aspect ratio of the magnetic tunnel junction element having a low coercive force is set to 1.3 to 1.5, then the resulting coercive force of the magnetic tunnel junction element is 0.3 to 0.4, and if the aspect ratio of the magnetic tunnel junction element having a high coercive force is 2.0, then the coercive force of the magnetic tunnel junction element is 0.58. Thus, a sufficient difference in coercive force can be obtained. It is to be noted that setting of the coercive force lower than 2.4 kA/m (≈30 Oe) is not preferable because, for example, it gives rise to deterioration of the writing characteristic.

Figure 4:
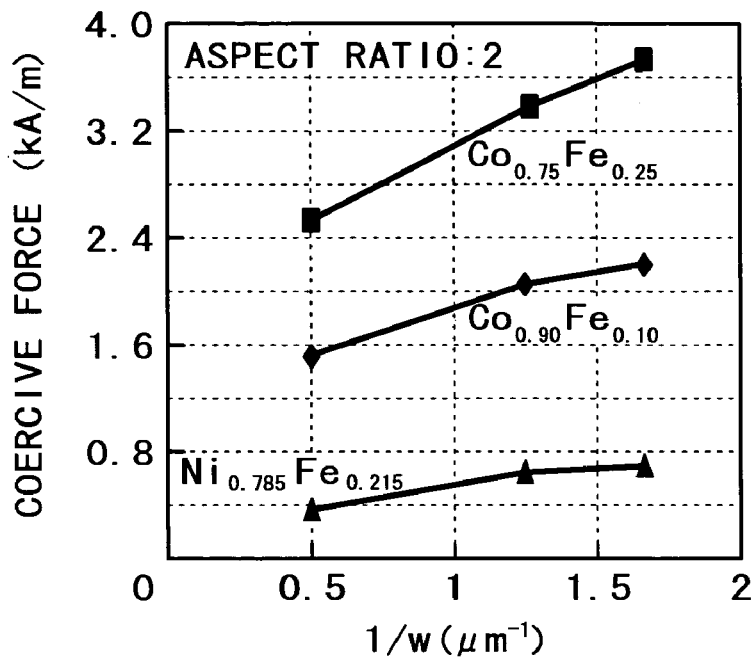
FIG. 4 is a graph illustrating a relationship between the coercive force and the MTJ width of the magnetic tunnel junction-type element where the material and the composition of a storage layer are used as parameters.

Now, an MTJ width dependency of the coercive force where the material and the composition of the material of the storage layer (also called free layer) of the magnetic tunnel junction element (MTJ) are used as parameters is described with reference to FIG. 4. In FIG. 4, the axis of ordinate indicates the coercive force, and the axis of abscissa indicates the MTJ width. Here, the aspect ratio of the magnetic tunnel junction element is 2.

It can be seen from FIG. 4 that, by also changing the material for the storage layer in this manner, or by also changing the minor side length w of the magnetic tunnel junction element while the aspect ratio is kept fixed, the coercive force can be controlled. For example, in the case of a cobalt-iron alloy ($Co_{0.75}Fe_{0.25}$), when 1/w=0.5, the coercive force is 2.5 kA/m (≈31.5 Oe); when 1/w=1.25, the coercive force is 3.4 kA/m (≈42.3 Oe); and when 1/w=1.7, the coercive force is 3.7 kA/m (≈46.5 Oe). Meanwhile, in another cobalt-iron alloy ($Co_{0.90}Fe_{0.10}$), when 1/w=0.5, the coercive force is 1.5 kA/m (≈18.9 Oe); when 1/w=1.25, the coercive force is 2.0 kA/m (≈25.5 Oe); and when 1/w=1.7, the coercive force is 2.3 kA/m (≈28.3 Oe). Further, in a nickel-iron alloy ($Ni_{0.785}Fe_{0.215}$), when 1/w=0.5, the coercive force is 0.3 kA/m (≈4.3 Oe); when 1/w=1.25, the coercive force is 0.6 kA/m (≈8.1 Oe); and when 1/w=1.7, the coercive force is 0.7 kA/m (8.9 Oe).

Thus, an MRAM integrated circuit which exhibits generally low power consumption can be implemented by the following chip design. In particular, writing into a portion in which data are rewritten comparatively frequently is performed with a comparatively low external magnetic field of 2.4 kA/m to 4.8 kA/m (approximately 30 Oe to 60 Oe) by setting the aspect ratio of the MTJ element to a low level so as to obtain a low coercive force, by setting the element size comparatively great while the aspect ratio is kept fixed or by using a nickel-ion (NiFe) alloy as a material for the storage layer. On the other hand, a block into which data are rewritten less frequently is formed such that a high aspect ratio is used for the MTJ element or a comparatively small element size is used while the aspect ratio is kept fixed or else a cobalt-iron ($Co_{0.90}Fe_{0.10}$, $Co_{0.75}Fe_{0.25}$ or the like) alloy having a comparatively low content of iron (Fe) is used for the storage layer so as to have a high coercive force and have a high thermal stability.

Figure 5:
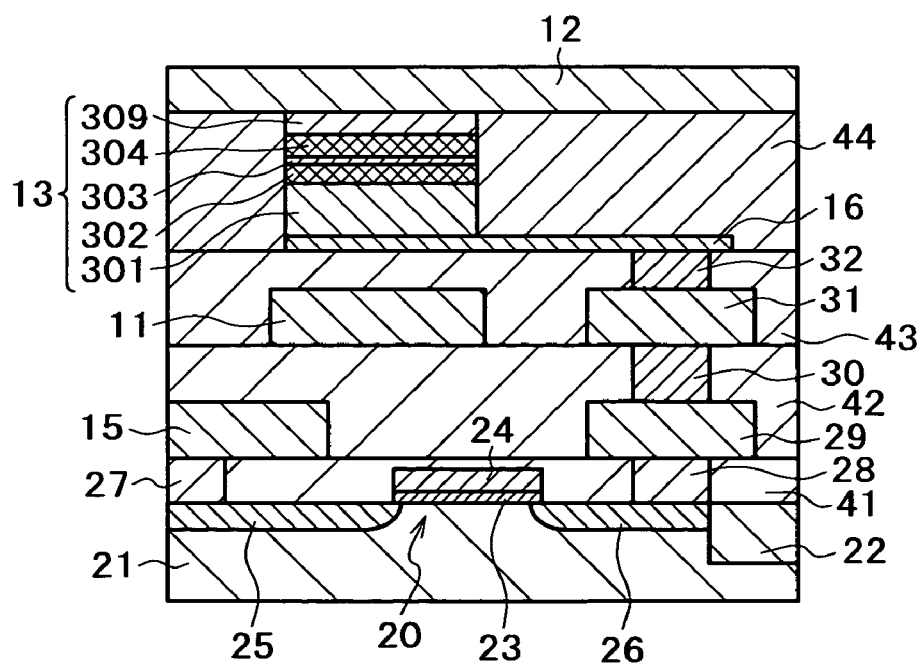
FIG. 5 is a schematic sectional view showing an example of a configuration of a memory cell section of the magnetic storage device of FIG. 1.

Now, an example of a sectional structure of one memory cell of a magnetic recording device is described with reference to FIG. 5. FIG. 5 shows a sectional structure of a memory cell section of an MRAM apparatus of the 1T1J type which includes one selection element (for example, one transistor) and one magnetic tunnel junction element (for example, a 1TMR element).

The sectional structure shown includes a semiconductor substrate (for example, a p-type semiconductor substrate) 21 on which a device isolating region 22 for isolating transistor formation regions from each other is formed in an STI (Shallow Trench Isolation) fashion. It is to be noted that a p-type well region (not shown) may be formed on the surface side of the semiconductor substrate 21. A gate electrode (word line) 24 is formed on the semiconductor substrate 21 with a gate insulating film 23 interposed therebetween, and diffused layers (for example, N+ diffused layers) 25 and 26 are formed on the semiconductor substrate 21 on the opposite sides of the gate electrode 24, thereby forming a field effect transistor 20 for selection.

The field effect transistor 20 functions as a switching element for reading out. The switching element may be formed from a suitable one of various switching elements such as an n-type or p-type field effect transistor, a diode and a bipolar transistor.

A first insulating film 41 is formed in such a state as to cover over the field effect transistor 20. Contacts (for example, tungsten plugs) 27 and 28 for connection to the diffused layers 25 and 26, respectively, are formed on the first insulating film 41. Also, a sense line 15 connecting to the contact 27, a first landing pad 29 connecting to the contact 28 and so forth are formed on the first insulating film 41.

A second insulating film 42 is formed on the first insulating film 41 and covers over the sense line 15, first landing pad 29 and so forth. A contact (for example, a tungsten plug) 30 connecting to the first landing pad 29 is formed on the second insulating film 42. Also, a second landing pad 31 connecting to the contact 30, a writing word line 11 and so forth are formed on the second insulating film 42.

A third insulating film 43 is formed on the second insulating film 42 and covers over the writing word line (first wiring line) 11, the second landing pad 31 and so forth. A contact (for example, a tungsten plug) 32 connecting to the second landing pad 31 is formed on the third insulating film 43.

A leader electrode 16 is formed on the third insulating film 43 and connected to the contact 32 from above the writing word line 11. An antiferromagnetic substance layer 301 is formed on the leader electrode 16 above the writing word line 11, and a reinforcement fixing layer 302 formed from a ferromagnetic substance layer and a storage layer 304 whose magnetization rotates comparatively readily are formed on the antiferromagnetic substance layer 301 with a tunnel insulating layer 303 interposed therebetween above the writing word line 11. Further, a cap layer 309 is formed on the storage layer 304. A magnetic tunnel junction element 13 (for example, a TMR element) is formed from the elements from the antiferromagnetic substance layer 301 to the cap layer 309 in this manner.

A fourth insulating film 44 is formed on the third insulating film 43 and covers over the leader electrode 16, magnetic tunnel junction element 13 and so forth. The fourth insulating film 44 has a flattened surface, and the surface of the cap layer 309 which is the uppermost layer of the magnetic tunnel junction element 13 is exposed on the surface of the fourth insulating film 44. A bit line (second wiring line) 12 is formed on the fourth insulating film 44 such that it connects to the upper face of the magnetic tunnel junction element 13 and three-dimensionally intersects with the writing word line 11 with the magnetic tunnel junction element 13 interposed therebetween.

The storage layer 304 and the reinforcement fixing layer 302 are made of a ferromagnetic substance which contains, for example, nickel, iron, or cobalt or an alloy composed of at least two of nickel, iron and cobalt as a principal component thereof. Further, the reinforcement fixing layer 302 may be formed not as a single layer but as a synthetic antiferromagnetic multilayer film including a metal layer interposed between two ferromagnetic substance layers (refer to S. S. P. Parkin et al., Phys. Rev. Lett. 64, 2304, 1990).

The metal layer provided in the magnetization fixing layer is formed from, for example, ruthenium, copper, chrome, metal, silver or the like. The reinforcement fixing layer 302 is formed in a contacting relationship with the antiferromagnetic substance layer 301 so that the reinforcement fixing layer 302 has a strong one-directional magnetic anisotropy due to an exchange interaction acting between the reinforcement fixing layer 302 and the antiferromagnetic substance layer 301.

The antiferromagnetic substance layer 301 may be formed from one or a plurality of ones selected from, for example, an iron-manganese alloy, a nickel-manganese alloy, a platinum-manganese alloy, an iridium-manganese alloy, a rhodium-manganese allow, a cobalt oxide and a nickel oxide.

The leader electrode 16 may otherwise serve also as the antiferromagnetic substance layer 301. In other words, the leader electrode 16 may be formed from an antiferromagnetic substance.

The tunnel insulating layer 303 is made of, for example, aluminum oxide, magnesium oxide, silicon oxide, aluminum nitride, magnesium nitride, silicon nitride, aluminum oxynitride, magnesium oxynitride or silicon oxynitride.

The tunnel insulating layer 303 has a function of cutting the magnetic coupling between the storage layer 304 and the reinforcement fixing layer 302 and also of supplying tunnel current therethrough. The magnetic films and the conductive films mentioned are formed principally by sputtering. The tunnel insulating layer can be obtained by oxidizing, nitriding or oxynitriding a metal film formed by sputtering.

Further, the cap layer 309 is formed as the uppermost layer. The cap layer 309 has functions for prevention of interdiffusion and reduction in contact fiction between the magnetic tunnel junction element and a wiring line for connecting the magnetic tunnel junction element to another magnetic tunnel junction element and for prevention of oxidization of the storage layer 304. Usually, the cap layer 309 is formed from one or a plurality of ones selected from among copper, tantalum nitride, tantalum, titanium nitride and so forth.

While the magnetic films and the conductor films described above can be formed principally by sputtering, if a film forming material is available, then various film formation methods such as chemical vapor deposition (CVD), physical vapor deposition (PVD), vapor deposition, and atomic layer deposition (ALD) can be applied. Further, each wiring line may have an ordinary wiring line structure formed by etching of a wiring line material layer formed on an insulating film or may otherwise have a groove wiring structure formed by embedding a wiring line material in a groove formed on an insulating film.

Operation of the magnetic storage device 1 is described below. While the magnetic tunnel junction element 13 described above detects a variation of the tunnel current by a magneto-resistance effect to read out information, the effect of it relies upon the relative magnetization directions of the storage layer 304 and the reinforcement fixing layer 302.

Further, in the magnetic tunnel junction element 13, current is supplied to the bit line 12 and the writing word line 11 to form a composite magnetic field to change the magnetization direction of the storage layer 304 to record "1" or "0". Readout of the magnetic tunnel junction element 13 is performed by detecting a variation in the tunnel current by a magneto-resistance effect. When the magnetization directions of the storage layer 304 and the reinforcement fixing layer 302 are the same as each other, the magneto-resistance is low (this is represented, for example, as "0"), and when the magnetization directions of the storage layer 304 and the reinforcement fixing layer 302 are anti-parallel, the magneto-resistance is high (this is represented, for example, as "1").

Figure 6:
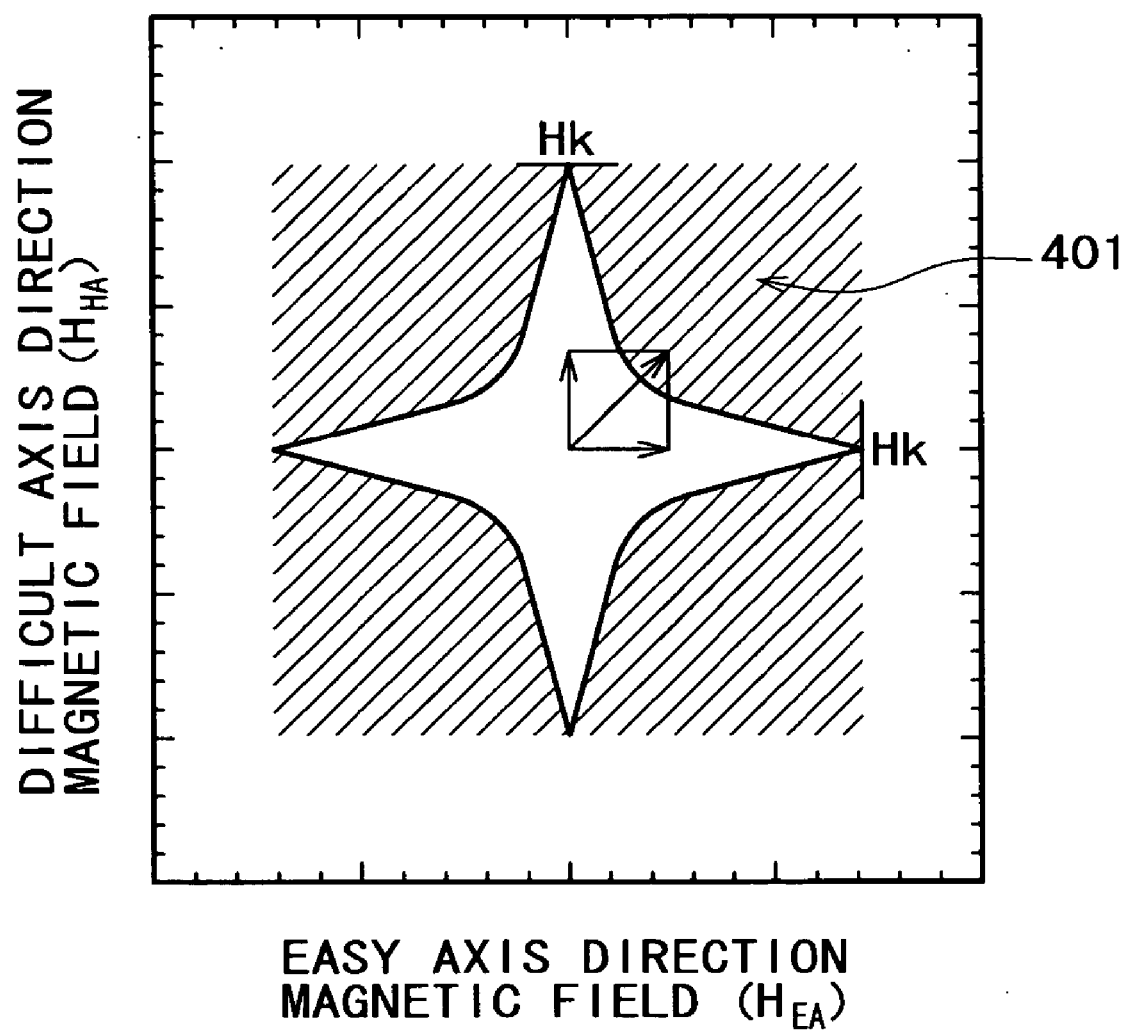
FIG. 6 is a diagram of an asteroid curve illustrating a reversal threshold value for a storage layer magnetization direction by an easy axis direction magnetic field $H_{EA}$ and a difficult axis direction magnetic field $H_{HA}$.

An asteroid curve shown in FIG. 6 indicates a reversal threshold value of a storage layer magnetization direction by an easy axis direction magnetic field $H_{EA}$ and a difficult axis direction magnetic field $H_{HA}$ applied as a composite magnetic field vector. If a composite magnetic field vector corresponding to the outside of the asteroid curve is generated, then reversal of the magnetic field occurs and writing of data can be performed thereby. A composite magnetic field vector in the inside of the asteroid curve does not cause reversal of a cell from one of current bistable conditions at all. Further, to any other cell than that at the intersecting point between a word line and a bit line along which electric current flows, an electric field generated solely by the word line or the bit line is applied. Therefore, if the magnitude of the applied magnetic field is higher than the one direction reversing magnetic field HK, then also the magnetization direction of the cell other than that at the intersecting point is reversed. Consequently, the selected cell is enabled for selective writing only when the composite magnetic field ranges within a portion 401 of the asteroid curve indicated by slanting lines in FIG. 6.

As described above, in the MRAM array, memory cells are arranged at intersecting points of a grating formed from bit lines and writing word lines. In the MRAM, it is usually the case that electric current is supplied through two wiring lines including a writing word line and a bit line to generate magnetic fields thereby to selectively write into individual memory cells making use of the asteroid magnetization reversal characteristic. Further, a magnetic field ($H_{EA}$) in the easy axis direction of a storage layer is produced by writing electric current flowing through a bit line, and a magnetic field ($H_{HA}$) in the difficult axis direction is produced by electric current flowing through a writing word line. Depending upon the configuration of memory cells, a magnetic field ($H_{HA}$) in the difficult axis direction may be produced by writing electric current flowing through a bit line, and a magnetic field ($H_{EA}$) in the easy axis direction may be produced by electric current flowing through a writing word line.

Embodiment 2

A second embodiment of the present invention relating to a method of manufacturing a magnetic storage device of the present invention is described with reference to FIGS. 7 and 8. FIGS. 7 and 8 particularly illustrate several steps in manufacturing MRAM memory cells having magnetic tunnel junction elements having different coercive forces from each other. More particularly, a process of forming a first storage element set 2 in the form of a cell array formed from a plurality of first magnetic tunnel junction elements having a low coercive force and a second storage element set 3 in the form of a cell array formed from a plurality of magnetic tunnel junction elements having a coercive force higher than that of the first magnetic tunnel junction elements is principally described. It is to be noted that, in each of FIGS. 7 and 8, a memory sell section of the first storage element set is shown on the left side while a memory cell section of the second storage element set is shown on the right side.

Manufacturing steps in the manufacturing method of the magnetic storage device of the present invention before formation of magnetic tunnel junction elements are similar to those in a conventional manufacturing method, and therefore, detailed description thereof is omitted herein.

Figure 7A:
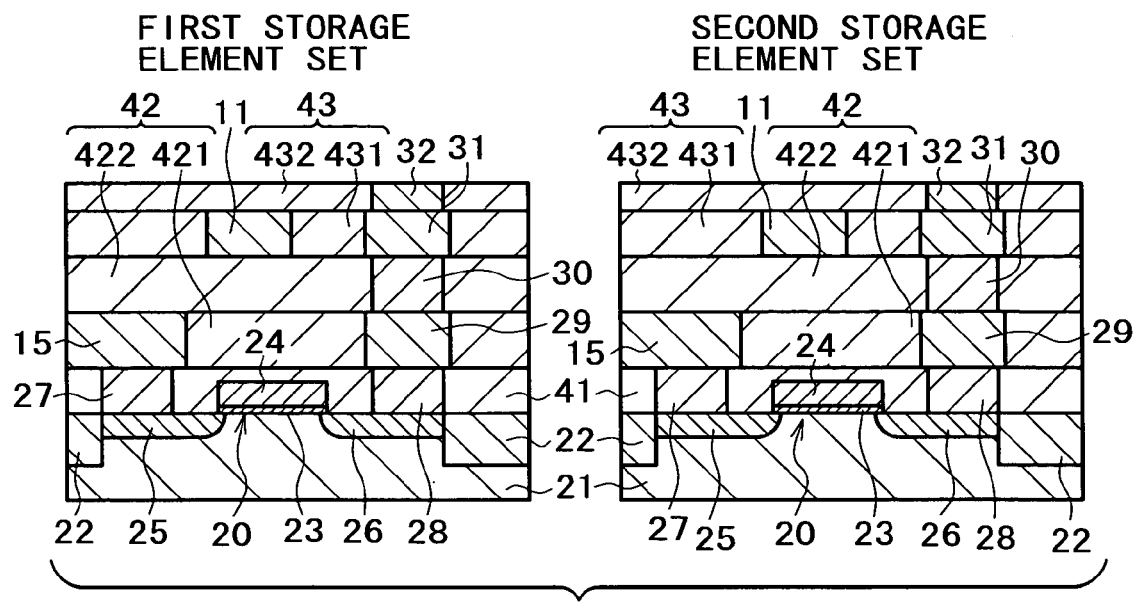
FIGS. 7A to 7C and 8A to 8C are sectional views illustrating several steps of a manufacturing method for a magnetic recording device according to a first embodiment of the present invention.

First, device isolating regions 22 for isolating transistor formation regions from each other are formed in an STI (Shallow Trench Isolation) fashion in formation regions for the first storage element set 2 and the second storage element set 3 on a semiconductor substrate (for example, p-type semiconductor substrate) 21 as seen in FIG. 7A. It is to be noted that a p-type well region (not shown) may be formed in advance on the surface side of the semiconductor substrate 21. Then, an ordinary manufacturing process for a gate electrode is applied to form gate electrodes (word line) 24 on the semiconductor substrate 21 with a gate insulating film 23 interposed therebetween. Further, diffused layers 25 and 26 (for example, N+ diffused layers) are formed on the semiconductor substrate 21 on the opposite sides of the gate electrodes 24 to form field effect transistors 20 for selection.

Then, a first insulating film 41 is formed in such a condition as to cover over the field effect transistors 20. Contacts (for example, tungsten plugs) 27 and 28 connecting to the diffused layers 25 and 26 are formed on the first insulating film 41. Further, a second insulating film lower layer 421 is formed on the first insulating film 41. Sense lines 15 connecting the contacts 27, first landing pads 29 connecting the contacts 28 and so forth are formed on the second insulating film lower layer 421 using, for example, an ordinary technique for forming a groove wiring line.

Then, a second insulating film upper layer 422 is formed on the second insulating film lower layer 421 in such a manner as to cover over the sense lines 15, first landing pads 29 and so forth to form a second insulating film 42. Contacts (for example, tungsten plugs) 30 connecting to the first landing pads 29 are formed on the second insulating film 42. Further, a third insulating film lower layer 431 is formed on the second insulating film 42. Second landing pads 31 connecting to the contacts 30, writing word lines 11 and so forth are formed on the third insulating film lower layer 431 using, for example, an ordinary technique for forming a groove wiring line.

A third insulating film upper layer 432 is formed on the third insulating film lower layer 431 in such a manner as to cover over the writing word lines (first wiring lines) 11, the second landing pads 31 and so forth to thereby form a third insulating film 43. Contacts (for example, tungsten plugs) 32 connecting to the second landing pads 31 are formed on the third insulating film 43. While the sense lines 15, writing word lines 11 and so forth described above are formed using an ordinary groove wiring line formation technique, it is also possible to use an ordinary wiring line formation method wherein, after a wiring line formation film is formed on an insulating film, a lithography technique, an etching technique or the like is utilized to pattern the wiring line formation film to form the sense lines 15, writing word lines 11 and so forth. It is to be noted that, in the figures beginning with FIG. 7B that are referred to in the following description, only a portion higher than the contacts 30, writing word lines 11, second landing pads 31 and so forth is shown, while the sense lines 15, field effect transistors 20 serving as selection elements, semiconductor substrates 21 and so forth are omitted for a simplified illustration.

Figure 7B:
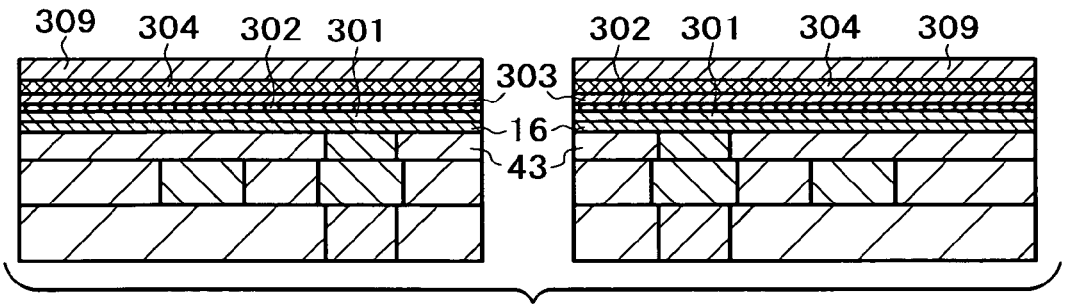

Further, leader electrodes 16, an antiferromagnetic substance layer 301, a reinforcement fixing layer 302, a tunnel insulating layer 303, a storage layer 304 and a cap layer 309 are successively deposited on the third insulating film 43 as seen in FIG. 7B, for example, by physical vapor deposition (PVD) to form a layered film.

The leader electrodes 16 are formed from a metal material or a conductive material, such as polycrystalline silicon.

The antiferromagnetic substance layer 301 may be formed from one or a plurality of ones selected from, for example, an iron-manganese alloy, a nickel-manganese alloy, a platinum-manganese alloy, an iridium-manganese alloy, a rhodium-manganese allow, a cobalt oxide and a nickel oxide.

The leader electrodes 16 may otherwise serve also as the antiferromagnetic substance layer 301. In other words, the leader electrodes 16 may be formed from an antiferromagnetic substance.

The storage layer 304 and the reinforcement fixing layer 302 are made of a ferromagnetic substance which contains, for example, nickel, iron, or cobalt or an alloy composed of at least two of nickel, iron and cobalt as a principal component thereof. Further, the reinforcement fixing layer 302 may be formed not as a single layer but as a synthetic antiferromagnetic multilayer film including a metal layer interposed between two ferromagnetic substance layers (refer to S. S. P. Parkin et al., Phys. Rev. Lett. 64, 2304, 1990). The metal layer provided in the magnetization fixing layer is formed from, for example, ruthenium, copper, chrome, metal, silver or the like. The reinforcement fixing layer 302 is formed in a contacting relationship with the antiferromagnetic substance layer 301 so that the reinforcement fixing layer 302 has a strong one-directional magnetic anisotropy due to an exchange interaction acting between the reinforcement fixing layer 302 and the antiferromagnetic substance layer 301. In particular, the magnetization direction of the reinforcement fixing layer 302 is spun by an exchange coupling with the antiferromagnetic substance layer 301 of the underlying layer. On the other hand, the magnetization direction of the storage layer 304 can be changed to a parallel direction or an anti-parallel direction with respect to that of the reinforcement fixing layer 302 by an externally applied magnetic field.

The tunnel insulating layer 303 is normally formed from aluminum oxide (Al2O3). Since the tunnel insulating layer 303 is as thin as 0.5 nm to 5 nm, the tunnel insulating layer 303 is formed using atomic layer deposition (ALD) or plasma oxidization after aluminum (Al) is deposited by sputtering. The tunnel insulating layer 303 may be made of, other than aluminum oxide, magnesium oxide, silicon oxide, aluminum nitride, magnesium nitride, silicon nitride, aluminum oxynitride, magnesium oxynitride or silicon oxynitride.

The tunnel insulating layer 303 has a function of cutting the magnetic coupling between the storage layer 304 and the reinforcement fixing layer 302 and also of supplying tunnel current therethrough. The magnetic films and the conductive films mentioned are formed principally by sputtering. The tunnel insulating layer can be obtained by oxidizing, nitriding or oxynitriding a metal film formed by sputtering.

Further, the cap layer 309 is formed as the uppermost layer. The cap layer 309 has functions for prevention of interdiffusion and reduction in contact fiction between the magnetic tunnel junction element and a wiring line for connecting the magnetic tunnel junction element to another magnetic tunnel junction element and for prevention of oxidization of the storage layer 304. Usually, the cap layer 309 is formed from one or a plurality of ones selected from among copper, tantalum nitride, tantalum, titanium nitride and so forth.

While the magnetic films and the conductor films described above can be formed principally by sputtering, if a film forming material is available, then various film formation methods such as chemical vapor deposition (CVD), physical vapor deposition (PVD), vapor deposition, and atomic layer deposition (ALD) can be applied.

Now, the first manufacturing method wherein the first magnetic tunnel junction elements of the first storage element set and the second magnetic tunnel junction elements of the second storage element set are formed so as to have different coercive forces from each other is described.

First, a method of forming magnetic tunnel junction elements having different coercive forces from each other by forming them with different sizes is described. In order to make the sizes of magnetic tunnel junction elements different from each other, the magnetic tunnel junction elements are formed such that the lengths of their minor diameters are different from each other. Alternatively, they are formed such that the aspect ratios thereof, which are each represented by the "major diameter/minor diameter", are made different from each other. They may also be formed such that the lengths of the minor diameters and the aspect ratios are made different from each other.

Figure 7C:
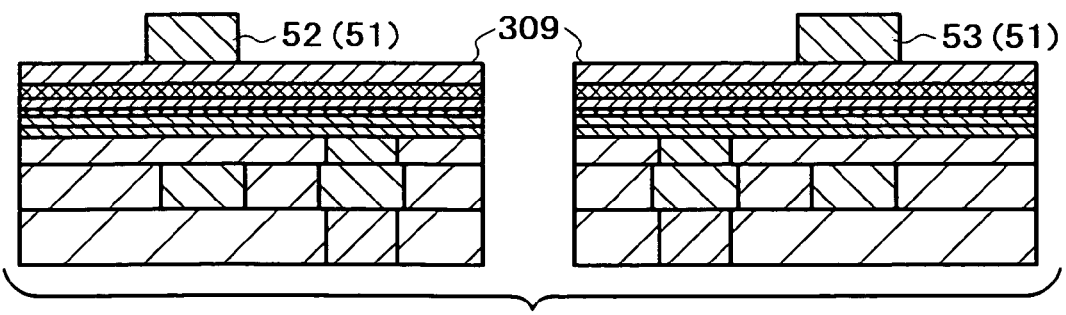

In those cases, a resist film 51 is formed on the cap layer 309 first as seen in FIG. 7C. Thereafter, the resist film 51 is patterned into the shape of first magnetic tunnel junction elements and the shape of second magnetic tunnel junction elements by lithography using a mask to form resist masks 52 and 53. Thereupon, on the mask used, a mask pattern to be used for formation of first magnetic tunnel junction elements and another mask pattern to be used for formation of second magnetic tunnel junction elements are formed so that the coercive force of the first magnetic tunnel junction elements and the coercive force of the second magnetic tunnel junction elements may be different from each other. In particular, the mask patterns are formed such that the lengths of the minor diameters thereof are different from each other, or the aspect ratios thereof, each represented by the "major diameter/minor diameter", are different from each other, or else both of the lengths of the minor diameters and the aspect ratios thereof are different from each other.

Figure 8A:
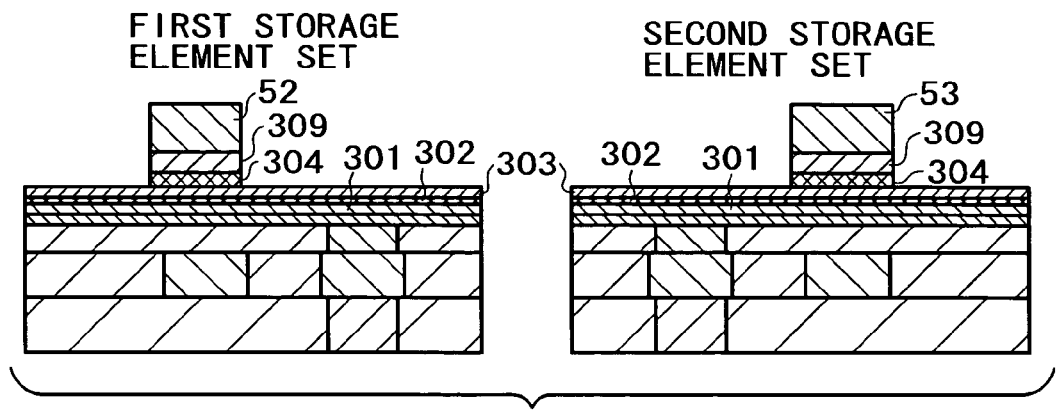

Thereafter, the patterned resist masks 52 and 53 are used as etching masks to form a cap layer 309, a storage layer 304 and a tunnel insulating layer 303 by etching as seen in FIG. 8A. The end point of the etching is set such that the etching ends at an intermediate portion of the tunnel insulating layer 303, reinforcement fixing layer 302 or antiferromagnetic substance layer 301 are made of aluminum oxide. Accordingly, the patterning may be performed up to the reinforcement fixing layer 302 or the antiferromagnetic substance layer 301. For the etching, halogen gas including chlorine (Cl) or gas containing carbon monoxide to which ammonia (NH3) is added is used.

Figure 8B:
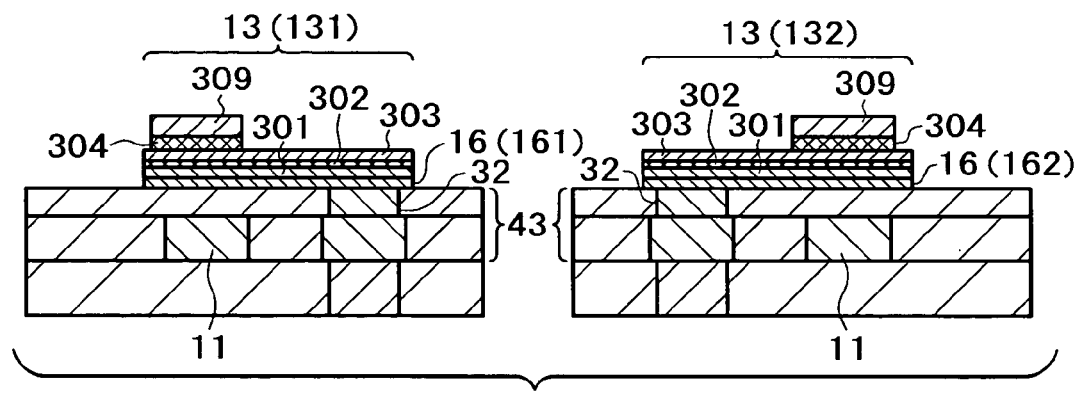

Thereafter, reactive ion etching wherein a photoresist is used as a mask is used to perform etching of the remaining layered films to form first magnetic tunnel junction elements 13 (131) of a first storage element set and leader electrodes 16 (161) for connecting the first magnetic tunnel junction elements 13 (131) to underlying wiring lines and form second magnetic tunnel junction elements 13 (132) of a second storage element set and leader electrodes 16 (162) for connecting the second magnetic tunnel junction elements 13 (132) to underlying wiring lines as seen in FIG. 8B. While the leader electrodes 16 are formed principally from a leader line electrode formation film 160, they may be formed including the antiferromagnetic substance layer 301, reinforcement fixing layer 302, tunnel insulating layer 303 and so forth as seen in the figure.

In this manner, the leader electrodes 16 connected to the contacts 32 from above the writing word lines 11 are formed on the third insulating film 43, and the antiferromagnetic substance layer 301 is formed on the leader electrodes 16 above the writing word lines 11. Further, the reinforcement fixing layer 302 formed from a ferromagnetic layer and the storage layer 304 whose magnetization rotates comparatively readily are formed on the antiferromagnetic substance layer 301 and above the writing word line 11 with the tunnel insulating layer 303 sandwiched therebetween. Further, the cap layer 309 is formed on the storage layer 304. In this manner, the magnetic tunnel junction element 13 is formed from the layers from the antiferromagnetic substance layer 301 to the cap layer 309.

Figure 8C:
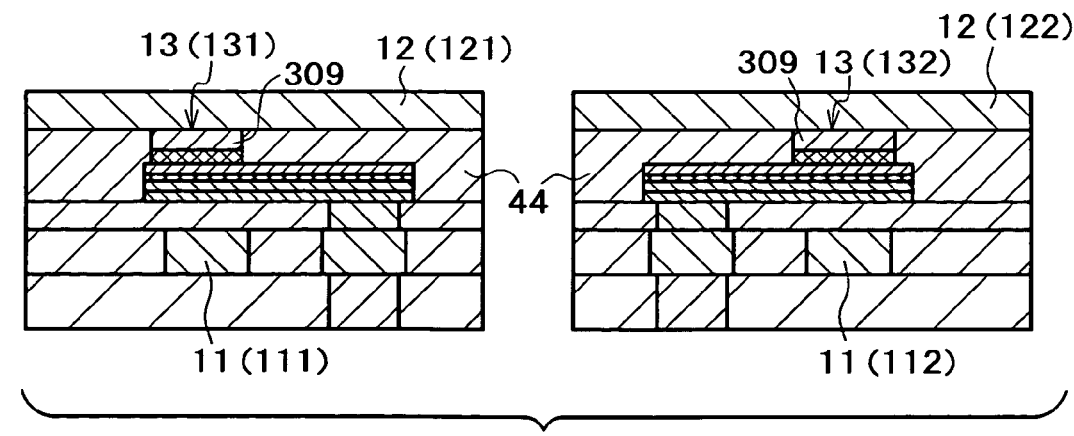

Thereafter, a fourth insulating film 44 is formed by deposition over an overall area by CVD or PVD, as seen in FIG. 8C. The fourth insulating film 44 is formed from an insulating film of, for example, silicon oxide ($SiO_2$), aluminum oxide ($Al_2O_3$) or the like. Thereafter, the surface of the fourth insulating film 44 is flattened, for example, by chemical mechanical polishing (CMP) to expose the surface of the cap layer 309 formed as the top layer of each of the magnetic tunnel junction elements 13. Thereafter, a standard wiring line formation technique is applied to form bit lines 12 (121 and 122) and form wiring lines (not shown) for peripheral circuits, bonding pad regions (not shown) and so forth on the fourth insulating film 44. In this instance, the bit lines 12 (121) are formed such that they are connected to upper faces of the magnetic tunnel junction elements 13 (131) of the first storage element set and intersect three-dimensionally (for example, intersect perpendicularly) with the writing word lines 11 (111) with the magnetic tunnel junction elements 13 (131) interposed therebetween. The bit lines 12 (122) are formed such that they are connected to upper faces of the magnetic tunnel junction elements 13 (132) of the second storage element group and intersect three-dimensionally (for example, intersect perpendicularly) with the writing word lines 11 (112) with the magnetic tunnel junction elements 13 (132) interposed therebetween. Further, a fifth insulating film (not shown) is formed over an overall area, for example, by depositing a plasma silicon nitride film. Then, bonding pad portions are opened to complete the wafer process steps for the LSI.

In the manufacturing method described above, in order to form magnetic tunnel junction elements having different coercive forces from each other, working of the layered films from the leader electrode 16 to the cap layer 309 is performed using a mask whose mask patterns are formed such that the lengths of the minor diameters of the magnetic tunnel junction elements are different from each other, or the aspect ratios of the magnetic tunnel junction elements each represented by the "major diameter/minor diameter" are different from each other, or else both of the lengths of the minor diameters and the aspect ratios of the magnetic tunnel junction elements are different from each other. In this manner, there is an advantage that a single mask on which patterns of storage elements including magnetic tunnel junction elements having different coercive forces from each other are drawn can be used to work thin film layers to form the different storage element sets at a time. In other words, magnetic tunnel junction elements having different coercive forces from each other can be formed selectively and separately on the same chip almost without modifying a conventional process.

For example, for a storage element set into which data are rewritten frequently, magnetic tunnel junction elements having a low coercive force can be formed to lower the writing power. On other hand, for a storage element set into which data are rewritten less frequently, magnetic tunnel junction elements having a high coercive force can be formed to assure high thermal stability to assure a sufficiently long data retention period (for example, retention for 10 years at 125° C.). Consequently, an integrated circuit chip which exhibits low power consumption over the overall chip and is superior in data retaining characteristic can be achieved. In other words, an MRAM device whose power consumption is low and which is superior in data retaining characteristic can be implemented.

Embodiment 3

Now, a third embodiment of the present invention relating to a method of manufacturing a magnetic storage device of the present invention wherein first magnetic tunnel junction elements of a first storage element set and second magnetic tunnel junction elements of a second storage element set have different coercive forces from each other is described.

According to the manufacturing method of the third embodiment, first magnetic tunnel junction elements and second magnetic tunnel junction elements having different coercive forces from each other are formed by forming the storage layer for the first magnetic tunnel junction elements and the storage layer for the second magnetic tunnel junction elements such that they have different thicknesses from each other. Accordingly, steps similar to those of the first manufacturing method described above may be used, except with regards to the method of forming the magnetic tunnel junction elements. Therefore, only the method of forming the magnetic tunnel junction elements is described below with reference to FIG. 9. It is to be noted that, in FIG. 9, a memory cell section of the first storage element set is shown on the left side, and a memory cell section of the second storage element set is shown on the right side.

Figure 9A:
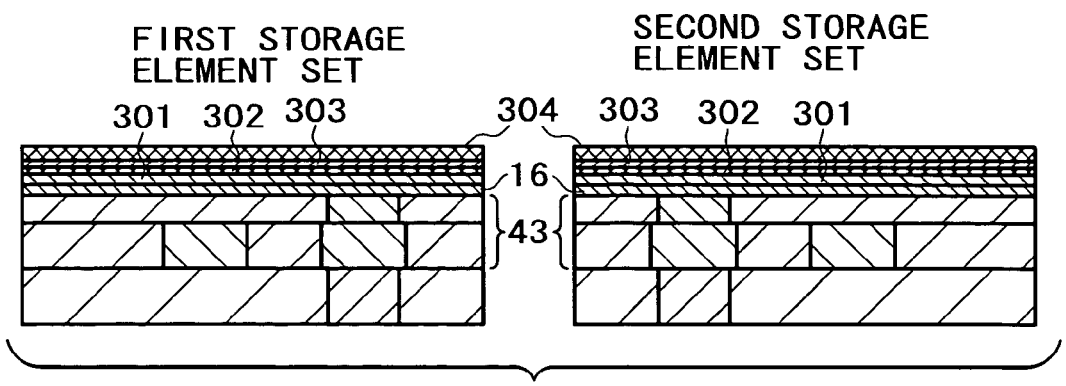
FIGS. 9A to 9D are sectional views illustrating several steps of a manufacturing method for a magnetic recording device according to a second embodiment of the present invention.

As shown in FIG. 9A, leader electrodes 16, an antiferromagnetic substance layer 301, a reinforcement fixing layer 302, a tunnel insulating layer 303 and a storage layer 304 are layered successively on a third insulating film 43 by, for example, physical vapor deposition (PVD).

Figure 9B:
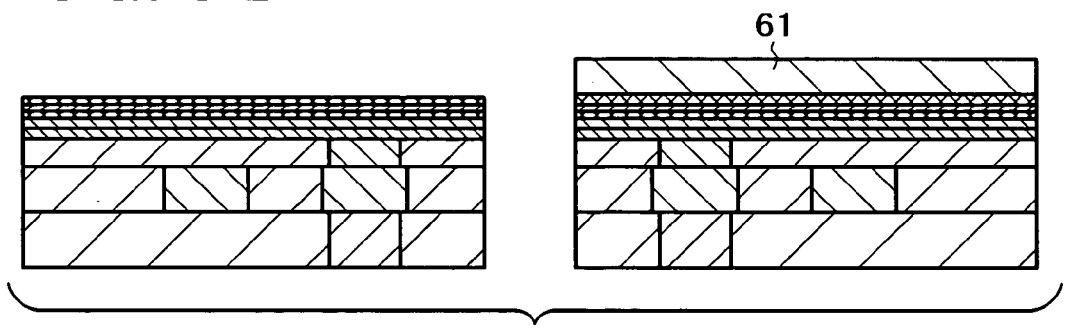
Figure 9C:
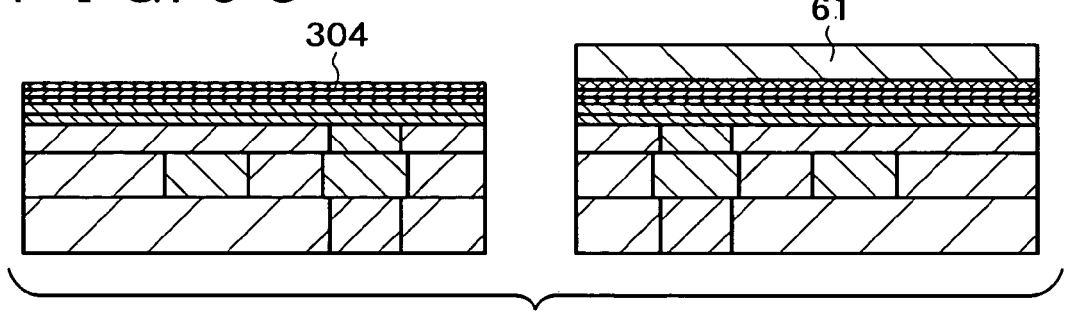

Then, a resist film 61 is formed on a formation region for the second storage element set as seen in FIG. 9B by resist application and lithography.

Then, the resist film 61 is used as an etching mask to form the storage layer 304 in a formation region for the first storage element set into a thin film by etching. For this etching, reactive ion etching or dry etching is used. In this instance, the storage layer 304 having a film thickness of 5 nm to 15 nm after the deposition is dry etched so that it has a reduced thickness of 2 nm to 5 nm. Thereafter, the resist film 61 is removed.

Figure 9D:
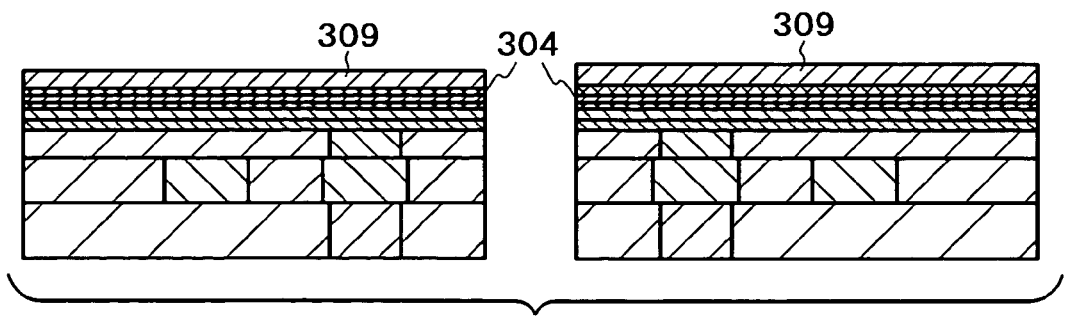

Thereafter, a cap layer 309 is formed over an overall area of the storage layer 304 side, as seen in FIG. 9D, for example, by PVD. The thickness of the cap layer 309 is, for example, 100 nm. Thereafter, a resist film 51 is formed on the cap layer 309 in a similar manner to that described hereinabove with reference to FIG. 7C. Thereafter, lithography is applied to pattern the resist film 51 into a shape of first magnetic tunnel junction elements and a shape of second magnetic tunnel junction elements. Thereafter, steps similar to those described hereinabove with reference to FIG. 8 are performed.

While in the manufacturing method of the third embodiment described above the storage layer 304 in the formation region for the first storage element set is formed thin by etching, it may be formed by a different manufacturing method. In particular, the storage layers 304 of the first and second storage element sets are formed thin with a thickness of the recording layer of the first recording element set from the beginning. Thereafter, a mask layer is formed in the formation region for the first storage element set. Then, a film to make a recording layer is formed by deposition over the overall area including the area of the mask layer. The second film deposition of the storage layer is continued until the film thickness of the recording layer for the second storage element set is reached. Thereafter, by also removing the storage layer deposited on the mask layer together with the mask layer, the storage layers in the formation region for the first storage element set and the formation region for the second storage element set can be formed with different film thicknesses from each other. It is to be noted that, upon the second deposition of the storage layer, the surface of the storage layer formed first may be cleaned, for example, by reverse sputtering.

According to the manufacturing method of the third embodiment described above, the storage layers in the formation region for the first storage element set and the formation region for the second storage element set can be formed with different film thicknesses from each other. Consequently, magnetic tunnel junction elements having a storage layer formed with a comparatively small film thickness can be formed with a coercive force lower than that of magnetic tunnel junction elements formed with a comparatively great film thickness. Accordingly, magnetic tunnel junction elements having different coercive forces from each other can be formed separately on the same chip.

For example, the writing power required by a storage element set wherein data are rewritten frequently can be reduced by forming magnetic tunnel junction elements of a low coercive force. On the other hand, for another storage element set wherein data are rewritten less frequently, if magnetic tunnel junction elements having a high coercive force are formed, then the thermal stability can be raised and sufficient data retaining time can be assured (for example, data are retained for 10 years at 125° C.). Consequently, an integrated circuit chip which exhibits low power consumption over the overall chip and is superior in data retaining characteristic can be achieved. In other words, an MRAM device whose power consumption is low and which is superior in data retaining characteristic can be implemented.

Embodiment 4

Now, a fourth embodiment of the present invention relating to a method of manufacturing a magnetic recording device of the present invention wherein first magnetic tunnel junction elements of a first storage element set and second magnetic tunnel junction elements of a second storage element set are formed such that they have different coercive forces from each other is described with reference to FIG. 10. It is to be noted that, in FIGS. 10 and 11, a memory cell section of the first storage element set is shown on the left side, and a memory cell section of the second storage element set is shown on the right side.

As shown in of FIG. 10A, leader electrodes 16, an antiferromagnetic substance layer 301, a reinforcement fixing layer 302, a tunnel insulating layer 303 and a first storage layer 3041 are layered successively on a third insulating film 43 by, for example, physical vapor deposition (PVD).

Then, a mask film 61 is formed only on a formation region for the first storage element set, as seen in FIG. 10B. The mask film 61 is formed using, for example, resist application and lithography. The mask film 61 may be formed from an inorganic film.

Then, the mask film 61 is used as an etching mask to form the first storage layer 3041 in a formation region for the second storage element set into a thin film by etching. For this etching, reactive ion etching or dry etching is used. In this instance, the first storage layer 3041 having a film thickness of 5 nm to 15 nm after the deposition is dry etched so that it has a reduced thickness of 2 nm to 5 nm. Thereafter, the mask film 61 is removed.

Then, a mask film 62 is formed only on the formation region for the first storage element set, as seen in FIG. 10D. The mask film 62 is formed, for example, by resist application and lithography. The mask film 62 may be formed from an inorganic film. It is to be noted that, in place of forming the mask film 62, the mask film 61 can be used without removing the mask film 61.

Figure 11A:
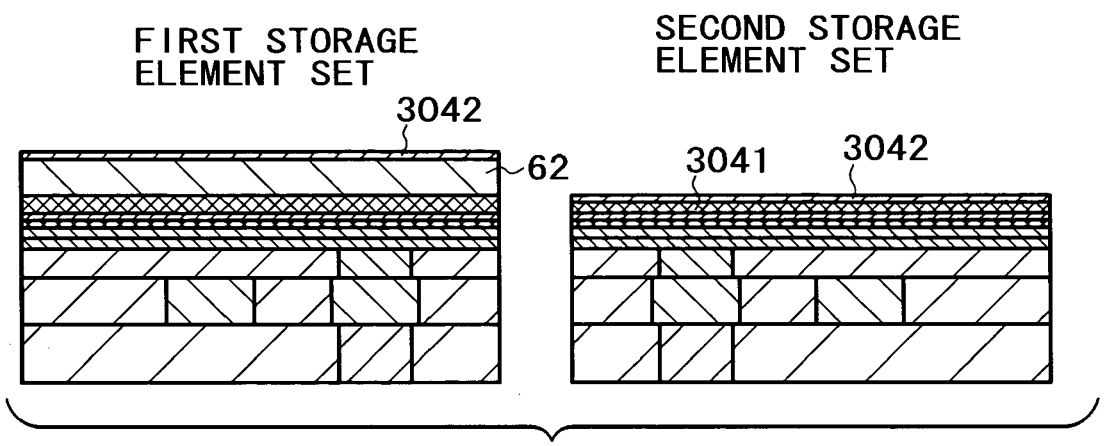

Then, a second storage layer 3042 having a coercive force different from that of the first storage layer 3041 is formed over the overall area on the side on which the mask film 62 is formed, as seen in FIG. 11A. Accordingly, the second storage layer 3042 is formed on the mask film 62 in the formation region for the first storage element set but is formed on the first storage layer 3041 in the formation region for the second storage element set. It is to be noted that, upon formation of the second storage layer 3042, the surface of the first storage layer 3041 may be cleaned, for example, by reverse sputtering.

Figure 11B:
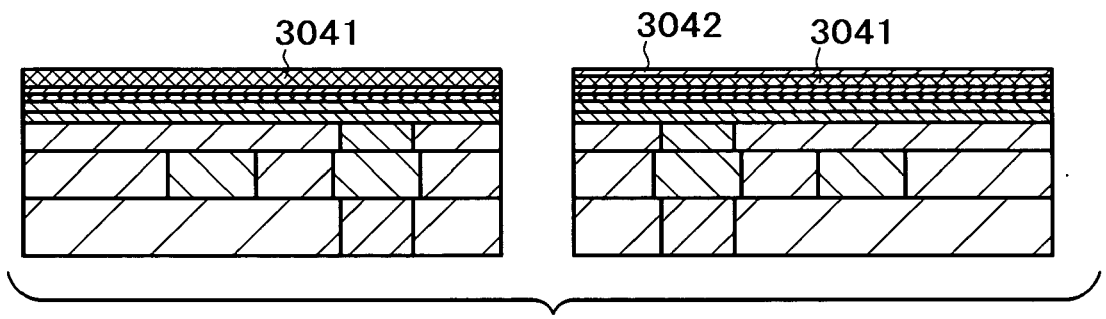

Thereafter, the mask film 62 is removed and also the second storage layer 3042 on the mask film 62 is removed. In particular, the second storage layer 3042 in the formation region for the first storage element set is removed by lift-off while the second storage layer 3042 is left only in the formation region for the second storage element set as seen in FIG. 11B. As a result, the first storage layer 3041 is formed in the formation region for the first storage element set while the first storage layer 3041 after converted into a thin film and the second storage layer 3042 having a predetermined thickness are formed in the formation region for the second storage element set. Consequently, storage layers of different materials from each other can be formed in the formation region for the first storage element set and the formation region for the second storage element set.

In order to form the first storage layer 3041 and the second storage layer 3042 such that the first storage layer 3041 has a lower coercive force while the second storage layer 3042 has a higher coercive force, for example, a nickel-iron alloy can be used for the first storage layer 3041 while a cobalt-iron alloy can be used for the second storage layer 3042. Or, cobalt-iron alloys having different composition ratios may be used. For example, a cobalt (90%)—iron (10%) alloy is used for the first storage layer 3041 while another cobalt (75%)—iron (25%) alloy is used for the second storage layer 3042. In this manner, a ferromagnetic substance having a comparatively low coercive force should be used for the first storage layer 3041 while another ferromagnetic substance having a comparatively high coercive force is used for the second storage layer 3042.

Figure 11C:
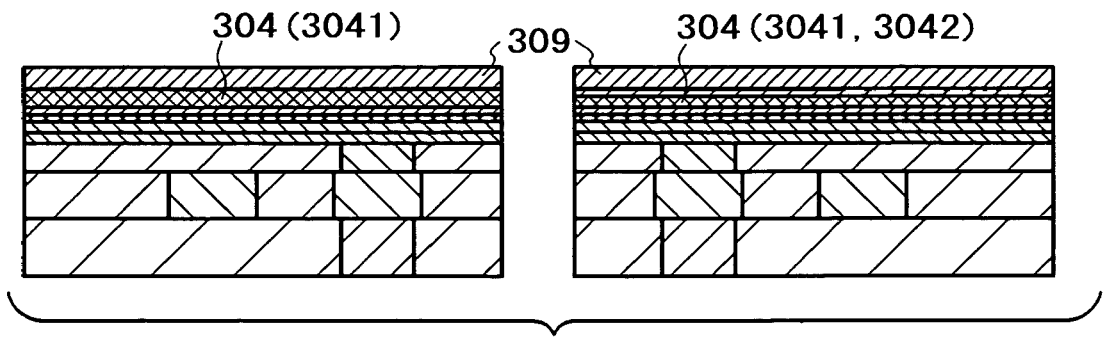

Thereafter, a cap layer 309 is formed over the overall area of the storage layer 304 (first storage layer 3041 and second storage layer 3042) side, as seen in FIG. 11C, for example, by PVD. The thickness of the cap layer 309 is, for example, 100 nm. Thereafter, a resist film 51 is formed on the cap layer 309 in a similar manner to that described hereinabove with reference to FIG. 7C. Then, the resist film 51 is patterned into a shape of the first magnetic tunnel junction elements and into a shape of the second magnetic tunnel junction elements by lithography. Thereafter, steps similar to those described hereinabove with reference to FIG. 8 are performed.

While in the manufacturing method of the fourth embodiment described above the first storage layer 3041 in the formation region side for the second storage element set is formed thin by etching, it may be formed by a different manufacturing method. In particular, the second storage layer 3042 having a high coercive force is formed over the overall area, and then the second storage layer 3042 on the first storage element set side is formed thin. Thereafter, a mask layer is formed in the formation region for the second storage element set. Then, the first storage layer 3041 having a coercive force lower than that of the second storage layer 3042 is formed by deposition over the overall area including the area on the mask layer. Then, the first storage layer 3041 is deposited to a predetermined film thickness, and then also the first storage layer 3041 deposited on the mask layer is removed together with the mask layer. By this process, the storage layers in the formation region for the first storage element set and the formation region for the second storage element set can be formed from different materials from each other. It is to be noted that, upon deposition of the first storage layer 3041, the surface of the second storage layer 3042 formed first may be cleaned, for example, by reverse sputtering.

According to the manufacturing method of the fourth embodiment described above, the storage layers in the formation region for the first storage element set and the formation region for the second storage element set can be formed from different materials from each other. Consequently, magnetic tunnel junction elements having the first storage layer 3041 formed from a material having a low coercive force can be formed with a coercive force lower than that of magnetic tunnel junction elements having the second storage layer 3042 formed from a material having a high coercive force. Accordingly, magnetic tunnel junction elements having different coercive forces can be formed separately on the same chip.

For example, for a storage element set into which data are rewritten frequently, magnetic tunnel junction elements having a low coercive force can be formed to lower the writing power. On other hand, for a storage element set into which data are rewritten less frequently, magnetic tunnel junction elements having a high coercive force can be formed to assure high thermal stability to assure a sufficiently long data retention period (for example, retention for 10 years at 125° C.). Consequently, an integrated circuit chip which exhibits low power consumption over the overall chip and is superior in data retaining characteristic can be achieved. In other words, an MRAM device whose power consumption is low and which is superior in data retaining characteristic can be implemented.

While preferred embodiments of the present invention have been described using specific terms, such description is for illustrative purposes only, and it is to be understood that changes and variations may be made without departing from the spirit or scope of the following claims.

What is claimed is:

1. A magnetic storage device, comprising:
a plurality of storage element sets each including a magnetic tunnel junction element; and
a plurality of power supplies for individually supplying writing currents corresponding to coercive forces of the magnetic tunnel junction elements of said storage element sets;
the magnetic tunnel junction element of at least one of said storage element sets having a coercive force different from that or those of the magnetic tunnel junction element or elements of the other storage element set or sets.

2. A magnetic storage device according to claim 1, wherein the magnetic tunnel junction elements having different coercive forces from each other have different minor diameters from each other.

3. A magnetic storage device according to claim 1, wherein the magnetic tunnel junction elements having different coercive forces from each other have different aspect ratios from each other each represented by their "major diameter/minor diameter".

4. A magnetic storage device according to claim 1, wherein the magnetic tunnel junction elements having different coercive forces from each other have different minor diameters and different aspect ratios from each other represented by their "major diameter/minor diameter".

5. A magnetic storage device according to claim 1, wherein the magnetic tunnel junction elements having different coercive forces from each other have storage layers having different thicknesses from each other.

6. A magnetic storage device according to claim 1, wherein the magnetic tunnel junction elements having different coercive forces from each other have storage layers formed from different materials from each other.

7. A magnetic storage device according to claim 1, wherein each of said power supplies can supply an amount of electric current necessary to reverse a magnetic field of the magnetic tunnel junction element of that one of said storage element sets which is connected to the power supply.

8. A magnetic storage device according to claim 1, further comprising a logic circuit to which said plurality of storage element sets are connected.

9. A writing method into a magnetic storage device which includes a plurality of storage element sets each including a magnetic tunnel junction element and means for supplying power for individually supplying writing currents corresponding to coercive forces of the magnetic tunnel junction elements of said storage element sets, the magnetic tunnel junction element of a first one of said storage element sets having a coercive force different from that or those of the magnetic tunnel junction element or elements of the other storage element set or sets, said writing method comprising:

using a first writing electric current corresponding to the coercive force of the magnetic tunnel junction element of the first one of said storage element sets; and using a second writing electric current corresponding to the coercive force of the magnetic tunnel junction element of the other storage element set or sets, wherein the second writing electric current differs from the first writing electric current, to write information into the storage element set.

10. The writing method of claim 9, wherein the first writing electric current is lower than the second writing electric current, to provide a reduced power consumption when using the first writing electric current.

11. The writing method of claim 9, wherein the second electric writing current is higher than the first writing electric current, in correspondence with the coercive force of the magnetic tunnel junction element that provides relatively higher thermal stability.

* * * * *